United States Patent
Rawat et al.

(10) Patent No.: US 11,002,766 B2
(45) Date of Patent: May 11, 2021

(54) DETECTION OF LOOP RESISTANCE AND LEAKAGE CURRENT IN INPUT/OUTPUT (I/O) LOOP

(71) Applicant: Honeywell International Inc., Morris Plains, NJ (US)

(72) Inventors: Supriya Rawat, Hyderabad (IN); Sharad Gitaram Pathare, Ahmednagar (IN); Sarabjit Singh, Hyderabad (IN); Anant Vitthal Vidwans, Hyderabad (IN)

(73) Assignee: Honeywell International Inc., Morris Plains, NJ (US)

( * ) Notice: Subject to any disclaimer, the term of this patent is extended or adjusted under 35 U.S.C. 154(b) by 158 days.

(21) Appl. No.: 16/285,384

(22) Filed: Feb. 26, 2019

(65) Prior Publication Data
US 2020/0271694 A1 Aug. 27, 2020

(51) Int. Cl.
*G01R 15/14* (2006.01)
*G01R 19/00* (2006.01)
*G01R 19/25* (2006.01)

(52) U.S. Cl.
CPC ....... *G01R 15/148* (2013.01); *G01R 19/0023* (2013.01); *G01R 19/2513* (2013.01)

(58) Field of Classification Search
CPC .............. G01R 15/148; G01R 19/2513; G01R 19/0023; G01L 27/007; G01L 19/086; A61N 1/057; A61N 1/025
USPC .. 324/500, 750.3, 757.04, 762.03, 600, 663, 324/671, 200, 207.13, 207.22, 239, 241, 324/515, 520, 530, 76.11, 105–124
See application file for complete search history.

(56) References Cited

U.S. PATENT DOCUMENTS

| | | | |
|---|---|---|---|
| 5,325,068 A | 6/1994 | Rauf | |
| 6,011,403 A | 1/2000 | Gillette | |
| 7,221,142 B2 | 5/2007 | Murray | |
| 2006/0020406 A1 | 1/2006 | Takakamo et al. | |
| 2008/0158754 A1* | 7/2008 | Krouth | G01L 1/2268 361/86 |

* cited by examiner

*Primary Examiner* — Melissa J Koval
*Assistant Examiner* — Trung Q Nguyen
(74) *Attorney, Agent, or Firm* — Ortiz & Lopez, PLLC; Luis M. Ortiz; Kermit D. Lopez

(57) ABSTRACT

A method includes obtaining different measurements of voltages across terminals of a field device coupled to an I/O loop. The voltage measurements are associated with corresponding loop currents flowing through the I/O loop. The method also includes identifying a baseline loop resistance measurement of the I/O loop using the voltage measurements and the loop currents. The method further includes obtaining additional measurements of voltages across the terminals of the field device. The additional voltage measurements are associated with additional corresponding loop currents flowing through the I/O loop. The method also includes identifying additional loop resistance measurements of the I/O loop using the additional voltage measurements and the additional loop currents. In addition, the method includes detecting a problem with the I/O loop based on the baseline loop resistance measurement and the additional loop resistance measurements.

20 Claims, 4 Drawing Sheets

DETECTION OF LOOP RESISTANCE AND LEAKAGE CURRENT IN INPUT/OUTPUT (I/O) LOOP

TECHNICAL FIELD

This disclosure generally relates to input/output (I/O) systems. More specifically, this disclosure relates to the detection of loop resistance and leakage current in an I/O loop.

BACKGROUND

Industrial process control and automation systems are often used to automate large and complex industrial processes. These types of systems routinely include various components including sensors, actuators, and controllers. Some of the controllers can receive measurements from the sensors, possibly through connected input/output (I/O) subsystems, and generate control signals for the actuators. Multiple I/O loops (also called control loops) are typically used in these types of systems. An I/O loop generally includes the physical loop wiring and any other elements (such as I/O subsystems) that communicatively couple an I/O device to a controller or other control system component or other component.

SUMMARY

This disclosure provides for the detection of loop resistance and leakage current in an input/output (I/O) loop.

In a first embodiment, an apparatus includes at least one processing device configured to obtain different measurements of voltages across terminals of a field device coupled to an I/O loop. The voltage measurements are associated with corresponding loop currents flowing through the I/O loop. The at least one processing device is also configured to identify a baseline loop resistance measurement of the I/O loop using the voltage measurements and the loop currents. The at least one processing device is further configured to obtain additional measurements of voltages across the terminals of the field device. The additional voltage measurements are associated with additional corresponding loop currents flowing through the I/O loop. The at least one processing device is also configured to identify additional loop resistance measurements of the I/O loop using the additional voltage measurements and the additional loop currents. In addition, the at least one processing device is configured to detect a problem with the I/O loop based on the baseline loop resistance measurement and the additional loop resistance measurements.

In a second embodiment, a method includes obtaining different measurements of voltages across terminals of a field device coupled to an I/O loop. The voltage measurements are associated with corresponding loop currents flowing through the I/O loop. The method also includes identifying a baseline loop resistance measurement of the I/O loop using the voltage measurements and the loop currents. The method further includes obtaining additional measurements of voltages across the terminals of the field device. The additional voltage measurements are associated with additional corresponding loop currents flowing through the I/O loop. The method also includes identifying additional loop resistance measurements of the I/O loop using the additional voltage measurements and the additional loop currents. In addition, the method includes detecting a problem with the I/O loop based on the baseline loop resistance measurement and the additional loop resistance measurements.

In a third embodiment, an apparatus includes at least one processing device configured to obtain different measurements of voltages across terminals of a field device coupled to an I/O loop. The voltage measurements are associated with corresponding loop currents flowing through the I/O loop. The at least one processing device is also configured to identify one or more values that are based on resistances in the I/O loop using the voltage measurements and the loop currents. The at least one processing device is further configured to detect a presence of leakage current in the I/O loop based on the one or more values.

In a fourth embodiment, a method includes obtaining different measurements of voltages across terminals of a field device coupled to an I/O loop. The voltage measurements are associated with corresponding loop currents flowing through the I/O loop. The method also includes identifying one or more values that are based on resistances in the I/O loop using the voltage measurements and the loop currents. The method further includes detecting a presence of leakage current in the I/O loop based on the one or more values.

In a fifth embodiment, a non-transitory computer readable medium contains instructions that when executed cause at least one processing device to perform the method of the second embodiment or any of its dependent claims. In a sixth embodiment, a non-transitory computer readable medium contains instructions that when executed cause at least one processing device to perform the method of the fourth embodiment or any of its dependent claims.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

Figure 1:
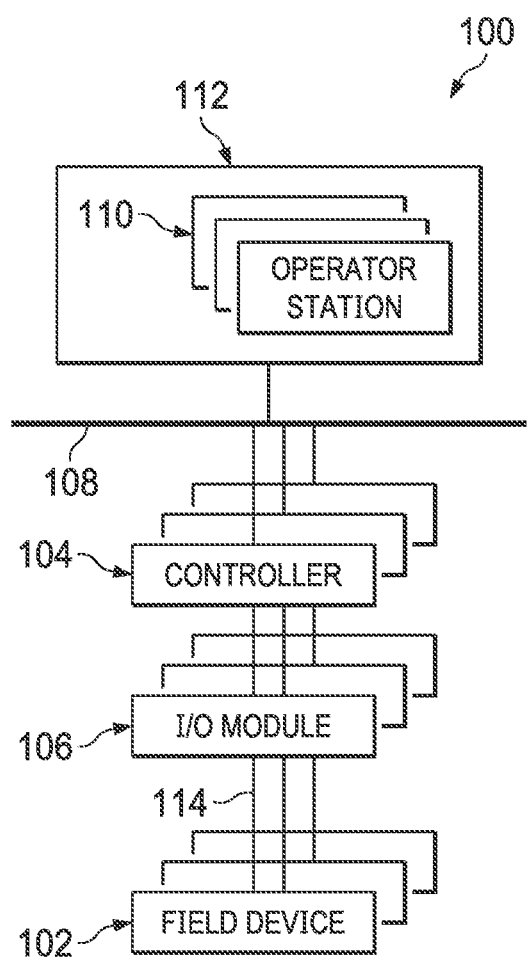
FIG. 1 illustrates an example industrial process control and automation system according to this disclosure.

FIGS. 1 through 6, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

As noted above, industrial process control and automation systems typically have hardware components participating in various control and input/output (I/O) functions. In many cases, I/O loops are used to communicatively couple field devices (such as sensors or actuators) to industrial process controllers or other control system components or other components. An I/O loop typically includes the physical loop wiring and any other elements (such as one or more cable trays, junction boxes, marshalling panels, or other or additional I/O subsystems) that communicatively couple an I/O device to a controller or other control system component (such as an I/O module) or other component. An I/O loop typically has an overall resistance that is referred to as a "loop resistance," and the electrical current flowing through an I/O loop is referred to as a "loop current." In control and automation systems, loop current is typically controlled or used by field devices over the I/O loops, and the loop current is transmitted to/from the control system.

Unfortunately, various situations may arise that can negatively affect or alter the loop resistance or the loop current of an I/O loop. For example, leakage can develop between different portions of an I/O loop, which allows part of a loop current to flow through the I/O loop without reaching a control system correctly. This can often arise due to wearing of electrical cables, water ingress into cables or equipment, or other unfavorable conditions in the field. As another example, corrosion on electrical terminals, the use of longer-than-normal loop wires, or environmental factors may cause an unexpectedly large loop resistance to appear in an I/O loop. These or other situations can increase or decrease the loop resistance of an I/O loop. Thus, these situations can lead to inaccurate measurements being made by control system components or other components using the loop current. These situations can also lead to false alarms based on the inaccurate measurements and can hamper control of industrial processes. In addition, excessive loop resistance can prevent an adequate supply voltage from being provided to a field device over an I/O loop, so the field device may not be able to receive adequate power for normal operation.

There is no known mechanism available in a control and automation system for automatically measuring a loop resistance of an I/O loop or for automatically verifying the correctness of a loop current transmitted over the I/O loop to a field device. As a result, the health of an I/O loop (as it relates to loop resistance and loop current) is often difficult or impossible to determine in an online manner. Also, an I/O loop and its associated field device typically need to be taken offline in order for personnel to identify a problem with loop resistance or loop current in an I/O loop. This can create significant disruptions to the operations of the control and automation system and the underlying industrial process(es) being controlled.

This disclosure describes various approaches for measuring and monitoring a loop resistance and/or a loop current of one or more I/O loops. For example, an algorithm can be used by a field device to determine the loop resistance of an I/O loop when the I/O loop is in a known good condition, such as during installation or commissioning of the field device. The determined loop resistance can be stored and used as a baseline resistance measurement. The loop resistance of the I/O loop can then be determined one or more additional times, such as periodically or at other times, and compared against the baseline resistance measurement. Any significant change in the loop resistance (such as by a threshold amount or percentage) can be used as an indication that the I/O loop is not healthy. A warning, alert, or other notification can then be provided to one or more users such as maintenance personnel, one or more control system components such as historians or operator displays, or other destination(s).

Moreover, the algorithm can be used by the field device to detect leakage current in the I/O loop using leakage current modeling. For example, the algorithm can identify the loop resistance as well as voltage and current measurements for an I/O loop when the I/O loop is in a known good condition, such as during installation or commissioning of the field device. The algorithm can also identify additional voltage and current measurements for the I/O loop one or more additional times, such as periodically or at other times. Based on this information, the field device can determine whether loop current has begun leaking in the I/O loop. Any significant leakage (such as an amount above a threshold) can be used as an indication that the I/O loop is not healthy. Once again, a warning, alert, or other notification can then be provided to one or more users such as maintenance personnel, one or more control system components such as historians or operator displays, or other destination(s).

In this way, problems associated with loop resistance or loop current in an I/O loop can be detected in an automated manner. This allows these problems to be detected more easily and to be resolved more quickly. Moreover, these approaches could be implemented in various field devices with or without requiring hardware modifications to the field devices and with or without requiring the use of additional hardware with the field devices. As a result, these approaches can be implemented in a simple and cost-effective manner. In addition, these approaches can be highly insensitive to power supply variations and can be minimally impacted by ambient temperature variations. Because of this, these approaches can be highly robust and can be used in a wide variety of applications.

FIG. 1 illustrates an example industrial process control and automation system 100 according to this disclosure. As shown in FIG. 1, the system 100 includes various components that facilitate production or processing of at least one product or other material. For instance, the system 100 can be used to facilitate control over components in one or multiple industrial plants. Each plant represents one or more processing facilities (or one or more portions thereof), such as one or more manufacturing facilities for producing at least one product or other material. In general, each plant may implement one or more industrial processes and can individually or collectively be referred to as a process system. A process system generally represents any system or portion thereof configured to process one or more products or other materials in some manner.

In the example shown in FIG. 1, the system 100 includes multiple field devices 102. Each field device 102 generally represents a device that provides input data to or receives output data from at least one other component of the system 100. For example, the field devices 102 may include one or more sensors and one or more actuators. The sensors and actuators represent components in a process system that may perform any of a wide variety of functions. For example, the sensors could measure a wide variety of characteristics in the process system, such as temperature, pressure, or flow rate. Also, the actuators could alter a wide variety of characteristics in the process system. Each of the sensors includes any suitable structure for measuring one or more characteristics in a process system. Each of the actuators includes any suitable structure for operating on or affecting one or more conditions in a process system.

The system 100 also includes one or more controllers 104. The controllers 104 can be used in the system 100 to perform various functions in order to control one or more industrial processes. For example, the controllers 104 may use measurements from one or more sensors to control the operation of one or more actuators. In some embodiments, the controllers 104 could interact with the sensors, actuators, and other field devices 102 directly via suitable I/O loops 114. In other embodiments, the controllers 104 could interact with the sensors, actuators, and other field devices 102 indirectly, such as via one or more I/O modules 106 that interact with the field devices 102 via suitable I/O loops 114. Also, in some embodiments, the controllers 104 may be arranged in redundant pairs, where one controller in each pair operates in a primary mode and the other controller in that pair operates in a redundant or backup mode (and is ready to take over operation if the primary controller fails).

Each controller 104 includes any suitable structure for controlling one or more aspects of an industrial process. At least some of the controllers 104 could, for example, represent proportional-integral-derivative (PID) controllers or multivariable controllers, such as Robust Multivariable Predictive Control Technology (RMPCT) controllers or other types of controllers implementing model predictive control (MPC) or other advanced predictive control. As a particular example, each controller 104 could represent a computing device running a real-time operating system, a WINDOWS operating system, or other operating system.

The one or more I/O modules 106 may be communicatively coupled to the field devices 102 and can facilitate interactions with the field devices 102. For example, an I/O module 106 could be used to receive one or more analog inputs (AIs), digital inputs (DIs), or other inputs from one or more field devices 102. An I/O module 106 could also be used to provide one or more analog outputs (AOs), digital outputs (DOs), or other outputs to one or more field devices 102. Each I/O module 106 includes any suitable structure(s) for receiving one or more input signals from or providing one or more output signals to one or more field devices 102. In some embodiments, the I/O modules 106 may be arranged in redundant pairs, where data can pass through both I/O modules to reach one or more destinations. However, the use of the I/O modules 106 is optional.

One or more networks 108 couple the controllers 104 and other devices in the system 100. The network 108 facilitates the transport of information between components. The network 108 could represent any suitable network or combination of networks. As particular examples, the network 108 could represent at least one Ethernet network.

Operator access to and interaction with the controllers 104 and other components of the system 100 can occur via various operator stations 110. Each operator station 110 could be used to provide information to an operator and receive information from an operator. For example, each operator station 110 could provide information identifying a current state of an industrial process to an operator, such as values of various process variables and warnings, alarms, or other states associated with the industrial process. Each operator station 110 could also receive information affecting how the industrial process is controlled, such as by receiving setpoints for process variables controlled by the controllers 104 or other information that alters or affects how the controllers 104 control the industrial process. Each operator station 110 includes any suitable structure for displaying information to and interacting with an operator.

Multiple operator stations 110 can be grouped together and used in one or more control rooms 112. Each control room 112 could include any number of operator stations 110 in any suitable arrangement. In some embodiments, multiple control rooms 112 can be used to control an industrial plant, such as when each control room 112 contains operator stations 110 used to manage a discrete part of the industrial plant.

This represents a brief description of one type of industrial process control and automation system that may be used to manufacture or process one or more materials. Additional details regarding industrial process control and automation systems are well-known in the art and are not needed for an understanding of this disclosure. Also, industrial process control and automation systems are highly configurable and can be configured in any suitable manner according to particular needs.

In particular embodiments, the various controllers 104, I/O modules 106, and operator stations 110 in FIG. 1 may represent or include computing or data processing devices. For example, each of the controllers, I/O modules, and operator stations could include one or more processing devices, such as one or more microprocessors, microcontrollers, digital signal processors (DSPs), field programmable gate arrays (FPGAs), application specific integrated circuits (ASICs), or discrete circuitry. Each of the controllers, I/O modules, and operator stations could also include one or more memories storing instructions and data used, generated, or collected by the processing device(s) or the larger device, such as a random access memory, read only memory, Flash memory, optical disc, hard drive, or any other suitable volatile or non-volatile storage device(s). Each of the controllers, I/O modules, and operator stations could further include at least one interface, such as one or more field device protocol interfaces, Ethernet interfaces, or wireless transceivers, that enables communications with other devices or systems.

In this example, the I/O loops 114 are used to communicatively couple the field devices 102 to one or more control system components, such as one or more controllers 104 or one or more I/O modules 106. Each I/O loop 114 includes any suitable components used to transport an I/O signal to or from an I/O device. For example, an I/O loop 114 may include physical loop wiring, which typically takes the form of an electrical wire having a conductive medium surrounded by a non-conductive sheathe or other electrical insulator. An I/O loop 114 may also include one or more cable trays, junction boxes, marshalling panels, or other or additional I/O subsystems, which are generally used to route or support the transport of electrical signals between wires and other conductive pathways.

In some embodiments, at least one I/O loop 114 can be used with a sourcing-type I/O channel. A sourcing-type I/O channel generally refers to an I/O channel in which electrical current is sourced by a controller 104, I/O module 106, or other device to a field device 102 and is used for input of data from or output of data to the field device 102. For example, when used with an analog or digital input channel, an input current can be provided by the controller 104 or I/O module 106 to the field device 102, and the field device 102 can alter its resistance or other characteristic(s) to vary the current drawn from the controller 104 or I/O module 106. In this case, the current can be used to represent analog values or digital states being sent from the field device 102. When used with an analog or digital output channel, an output current is driven by the controller 104 or I/O module 106 to the field device 102, and the output current can be varied by the controller 104 or I/O module 106. In that case, the current can be used to represent analog values or digital states being sent to the field device 102.

The field devices 102 and the I/O loops 114 are often exposed to many different types of environmental stresses or other stresses, and different components are often subjected to different environmental or other conditions that may lead to failures or false readings. For example, corrosion of electrical wiring or electrical terminals can cause high resistances to form in the I/O loops 114. Water ingress inside wires, cable conduits, or housings can interfere with the generation or transport of electrical signals in the I/O loops 114. Certain components of the field devices 102 or I/O loops 114 may not be properly grounded. Current leakages may occur in various components of the field devices 102 or I/O loops 114 due to a number of factors, such as the presence of conductive dust, wear and tear of cables, or electrical shorts. Any of these conditions or other conditions can affect or alter the loop resistance and/or the loop current in one or more I/O loops 114.

As described in more detail below, at least one component in the system 100 or other system supports the ability to measure and monitor a loop resistance and/or a loop current of an I/O loop 114. For example, each of at least one of the field devices 102 could execute an algorithm to repeatedly determine the loop resistance of its associated I/O loop 114. Based on those loop resistance measurements, the field device 102 can detect significant changes in the loop resistance (such as by a threshold amount or percentage) in order to detect problems with the I/O loop 114. Also or alternatively, each of at least one of the field devices 102 could execute an algorithm to detect leakage current in its associated I/O loop 114. For instance, the field device 102 could use loop resistance, voltage, and current measurements for the I/O loop 114 to identify whether loop current has begun leaking in the I/O loop 114 in order to detect problems with the I/O loop 114. If any problems are detected, the field device 102 may generate a warning, alert, or other notification that can be transmitted to a controller 104, operator station 110, or other destination(s). Note, however, that this functionality can be incorporated into any suitable device or devices and is not limited to use with industrial process control devices.

Although FIG. 1 illustrates one example of an industrial process control and automation system 100, various changes may be made to FIG. 1. For example, the system 100 could include any number of field devices, controllers, I/O modules, networks, operator stations, I/O loops, and other components in any suitable arrangement. Also, the makeup and arrangement of the system 100 in FIG. 1 is for illustration only. Components could be added, omitted, combined, further subdivided, or placed in any other suitable configuration according to particular needs. Further, particular functions have been described as being performed by particular components of the system 100. This is for illustration only. In general, control and automation systems are highly configurable and can be configured in any suitable manner according to particular needs. In addition, FIG. 1 illustrates one example operational environment in which the detection or monitoring of loop resistance and/or leakage current in an I/O loop can be supported. This functionality can be used in any other suitable system, and the system need not be related to industrial process control and automation.

Figure 2:
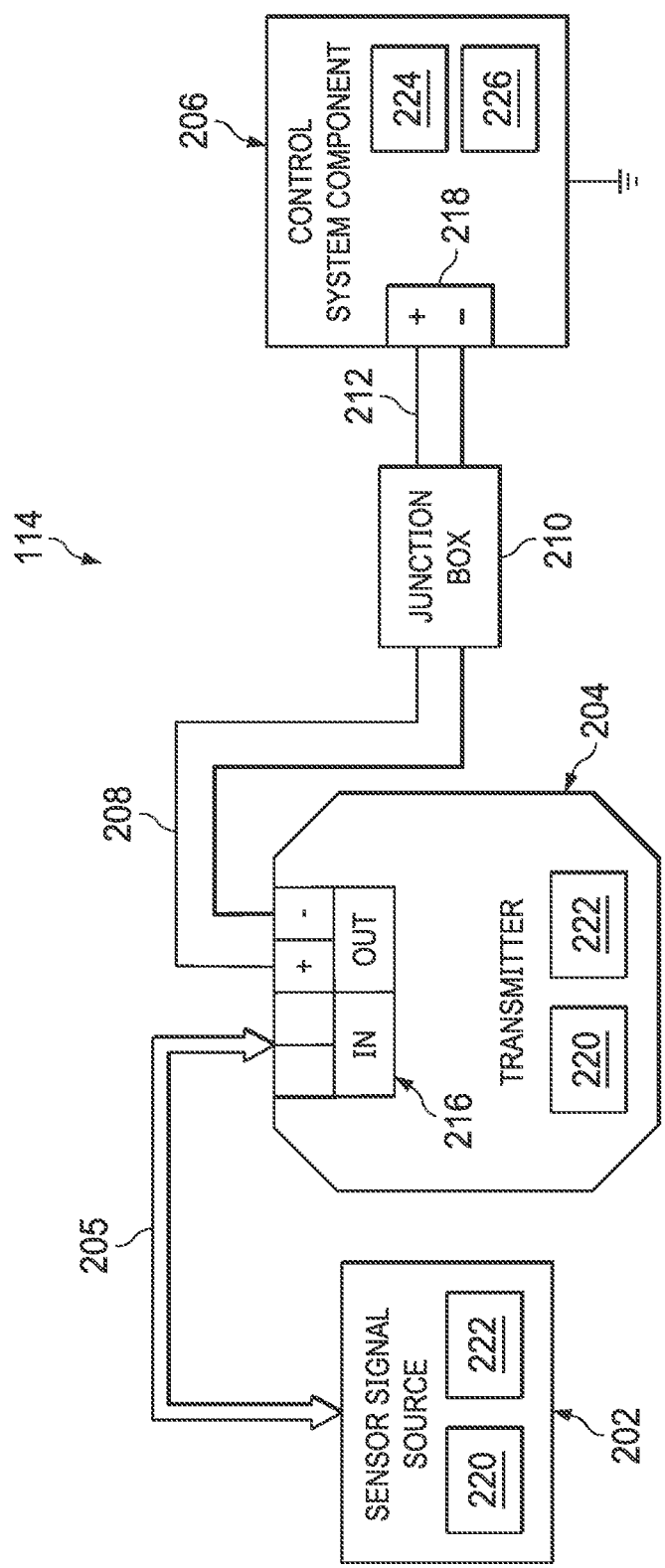
FIG. 2 illustrates an example input/output (I/O) loop in an industrial process control and automation system according to this disclosure.

FIG. 2 illustrates an example I/O loop 114 in an industrial process control and automation system according to this disclosure. For ease of explanation, the I/O loop 114 shown in FIG. 2 is described as being used in the industrial process control and automation system 100 shown in FIG. 1. However, the I/O loop 114 shown in FIG. 2 could be used in any other suitable system.

As shown in FIG. 2, a signal source 202 is communicatively coupled to a transmitter 204 via wiring 205. The signal source 202 generally represents any suitable source of an input signal provided to the transmitter 204 for transmission. For example, the signal source 202 could represent a sensor in the control and automation system 100 that captures sensor measurements and uses the input signal to provide the sensor measurements to the transmitter 204. Note, however, that any other suitable signal source could be used here as the signal source 202. The transmitter 204 generally operates here to communicate one or more signals over at least one transmission medium. The transmitter 204 includes any suitable structure configured to transmit one or more electrical signals. In some embodiments, both the signal source 202 and the transmitter 204 could form at least part of a field device 102. In other embodiments, the signal source 202 could form at least part of a field device 102, and the transmitter 204 can be provided outside of and be coupled to the field device 102. It should be noted that the use of the transmitter 204 is not required here and that the transmitter 204 could be replaced by a transceiver, which supports both transmission and reception of data over an I/O loop 114. In general, a field device 102 or an associated component could be used to transmit (and possibly receive) data over an I/O loop 114. The wiring 205 represents at least one electrical wire or other electrical conductor. Note that if the signal source 202 and the transmitter 204 are implemented within the same physical device, the wiring 205 may be extremely short or omitted altogether.

The transmitter 204 in this example communicates with a control system component 206. The control system component 206 generally represents any suitable component of a control and automation system that can communicate with at least one device via at least one I/O loop. For example, the control system component 206 could represent a controller 104 or an I/O module 106 in the control and automation system 100. However, any other suitable component or components in the control and automation system 100 could be used here.

In this example, the I/O loop 114 includes loop wiring 208, which represents at least one electrical wire or other electrical conductor coupling the transmitter 204 and the control system component 206. The loop wiring 208 represents any suitable electrical conductor and can have any suitable length. The I/O loop 114 may also optionally include at least one I/O subsystem 210, which in this example represents at least one junction box. A junction box represents an enclosure that houses electrical connections between the loop wiring 208 and additional wiring 212. Note, however, that other types of I/O subsystems 210 could be used here to transport or route one or more electrical signals. For example, one or more cable trays can be used to physically hold and allow routing of electrical cables. As another example, one or more marshalling panels can be used to provide cross-wiring functionality between the wiring 208 connected to field devices 102 and the wiring 212 connected to control system components.

In the example embodiment shown in FIG. 2, the transmitter 204 includes various electrical terminals 216. Each electrical terminal 216 represents any suitable structure configured to be coupled to wiring or another conductive pathway to support communication to or from the transmitter 204. Various types of electrical terminals 216 can be used here, such as screw terminals. Also, the control system component 206 may include a power supply I/O card 218, which represents a structure containing electrical circuitry used to provide power to a field device and to provide data to or receive data from the field device. For example, the power supply I/O card 218 can generate an electrical current that provides power to the transmitter 204. Also, the transmitter 204 can modulate a signal over the electrical current to communicate with the power supply I/O card 218 (or vice versa).

As described in more detail below, a field device 102 can execute or otherwise implement an algorithm to measure and monitor loop resistance and/or loop current of an I/O loop 114 in order to identify the status and any problems with the I/O loop 114. In some embodiments, the algorithm could be executed using at least one processor 220 of the signal source 202 or the transmitter 204. Each processor 220 may represent a microprocessor, microcontroller, DSP, FPGA, ASIC, or discrete circuitry. If the algorithm is implemented using software or firmware instructions, the instructions could be stored on at least one memory 222. Each memory 222 may represent a random access memory, read only memory, Flash memory, optical disc, hard drive, or any other suitable volatile or non-volatile storage device.

In other embodiments, the field device 102 may collect various data and provide that data to the control system component 206 for analysis. In that case, the control system component 206 can execute or otherwise implement at least part of the algorithm to measure and monitor the loop resistance and/or the loop current of the I/O loop 114 in order to identify the status and any problems with the I/O loop 114. In some embodiments, the algorithm could be executed using at least one processor 224 of the control system component 206. Each processor 224 may represent a microprocessor, microcontroller, DSP, FPGA, ASIC, or discrete circuitry. If the algorithm is implemented using software or firmware instructions, the instructions could be stored on at least one memory 226. Each memory 226 may represent a random access memory, read only memory, Flash memory, optical disc, hard drive, or any other suitable volatile or non-volatile storage device. In still other embodiments, the field device 102 may collect various data and provide that data to the control system component 206, and the control system component 206 may provide that data to yet another component for processing. The other component may therefore include at least one processor that executes the algorithm, possibly along with at least one memory that stores instructions for the algorithm.

Although FIG. 2 illustrates one example of an I/O loop 114 in an industrial process control and automation system 100, various changes may be made to FIG. 2. For example, the I/O loop 114 shown in FIG. 2 is merely meant to illustrate example types of components that could be used to facilitate communication with a field device 102. Numerous other implementations of the I/O loop 114 are possible without departing from the scope of this disclosure. Also, when used in a system other than a process control and automation system, the component 206 could be replaced with any other suitable device.

Figure 3:
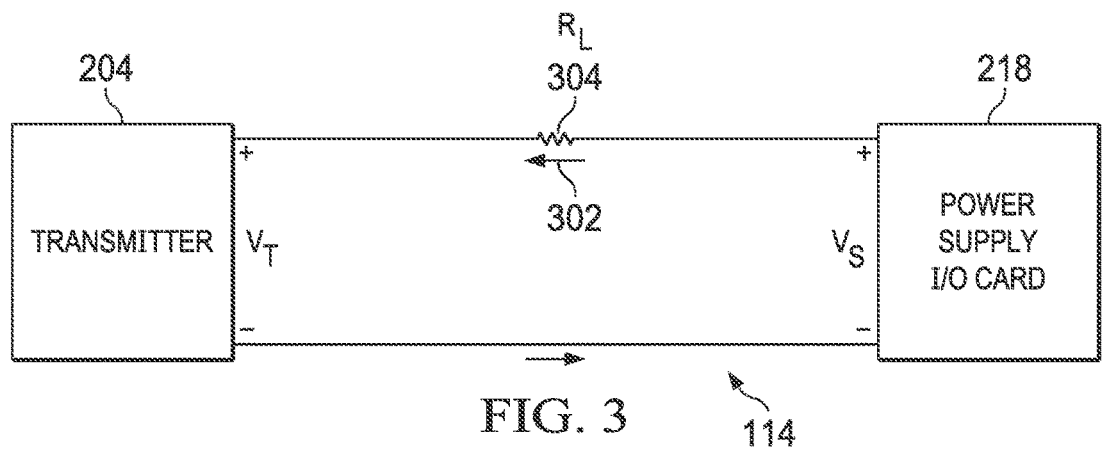
FIG. 3 illustrates an example operation of an I/O loop experiencing no leakage according to this disclosure.

FIG. 3 illustrates an example operation of an I/O loop 114 experiencing no leakage according to this disclosure. For ease of explanation, the operation shown in FIG. 3 is described as involving the I/O loop 114 shown in FIG. 2 within the industrial process control and automation system 100 shown in FIG. 1. However, the operation shown in FIG. 3 could be used with any other suitable I/O loop and in any other suitable system.

As shown in FIG. 3, the power supply I/O card 218 (or other power supply) applies a voltage $V_S$ across its terminals and provides a loop current 302 flowing through an I/O loop 114 to the transmitter 204. There is no leakage in this example, so all of the loop current 302 flows to and through the transmitter 204. However, not all of the voltage applied by the power supply I/O card 218 appears as a voltage $V_T$ across terminals of the transmitter 204. This is because the I/O loop 114 itself has some overall loop resistance $R_L$ 304. This loop resistance 304 may have multiple sources, such as the resistance of the loop wiring 208, the resistance of any additional wiring 212, and the resistance of any I/O subsystems 210. All of these resistances are represented collectively in FIG. 3 as the loop resistance 304.

In the no-leakage scenario shown in FIG. 3, the loop resistance 304 of the I/O loop 114 can be determined as follows. The transmitter 204 can set a first loop current $I_{T1}$ and measure a first voltage $V_{T1}$ across its terminals. The transmitter 204 can also set a second loop current $I_{T2}$ and measure a second voltage $V_{T2}$ across its terminals. Using those values, the following relationships can be expressed:

$$V_S = V_{T1} + I_{T1} \times R_L \quad (1)$$

$$V_S = V_{T2} + I_{T2} \times R_L \quad (2)$$

Subtracting Equation (2) from Equation (1) yields the following:

$$0 = \Delta V_T + \Delta I_T \times R_L \quad (3)$$

Here, $\Delta V_T$ represents the change in the voltages measured across the terminals of the transmitter 204 ($\Delta V_T = V_T - V_{T1}$), and $\Delta I_T$ represents the change in the loop current 302 ($\Delta I_T = I_{T2} - I_{T1}$). Based on this, it is possible for the transmitter 204 (or other component) to measure the loop resistance 304 of the I/O loop 114 using the following:

$$R_L = -\Delta V_T / \Delta I_T \quad (4)$$

Once the loop resistance 304 of the I/O loop 114 is known, it is also possible for the transmitter 204 (or other component) to measure the power supply voltage $V_S$ using Equation (1) or Equation (2) above.

Thus, it is possible for a transmitter 204, control system component 206, or other component to repeatedly identify the loop resistance of an I/O loop 114. For example, the loop resistance 304 of the I/O loop 114 can be determined when the I/O loop 114 is in a known good state, such as during installation or commissioning of the transmitter 204 or at any other suitable time. The transmitter 204 can calculate the loop resistance 304 of the I/O loop 114 here by setting the loop currents $I_{T1}$ and $I_{T2}$, measuring the resulting voltages $V_{T1}$ and $V_{T2}$, and determining the value of $(-\Delta V_T / \Delta I_T)$, which as shown above identifies the overall loop resistance 304 of the I/O loop 114. The original loop resistance measurement can be stored (such as in the memory 222 or 226) as a baseline loop resistance of the I/O loop 114. Multiple loop resistance measurements can also be captured and averaged or otherwise processed to identify the baseline loop resistance.

Subsequent loop resistance measurements can be compared to the baseline loop resistance measurement. As long as leakage or other problems are not occurring, the subsequent loop resistance measurements should closely match or equal the baseline loop resistance, and no problems may be detected. If a problem develops that affects the loop resistance (such as by increasing or decreasing the loop resistance), the transmitter 204 can detect and report the problem. In that case, the transmitter 204 can continue calculating the loop resistance of the I/O loop 114 by setting the loop currents $I_{T1}$ and $I_{T2}$, measuring the resulting voltages $V_{T1}$ and $V_{T2}$, and determining the value of $(-\Delta V_T / \Delta I_T)$. When the calculated loop resistance measurement differs from the baseline loop resistance (such as by some threshold amount or percentage), the transmitter 204 can generate a warning, alert, or other notification. Note that the transmitter 204 may require multiple calculated loop resistance values to differ from the baseline loop resistance before the notification is generated.

Figure 4:
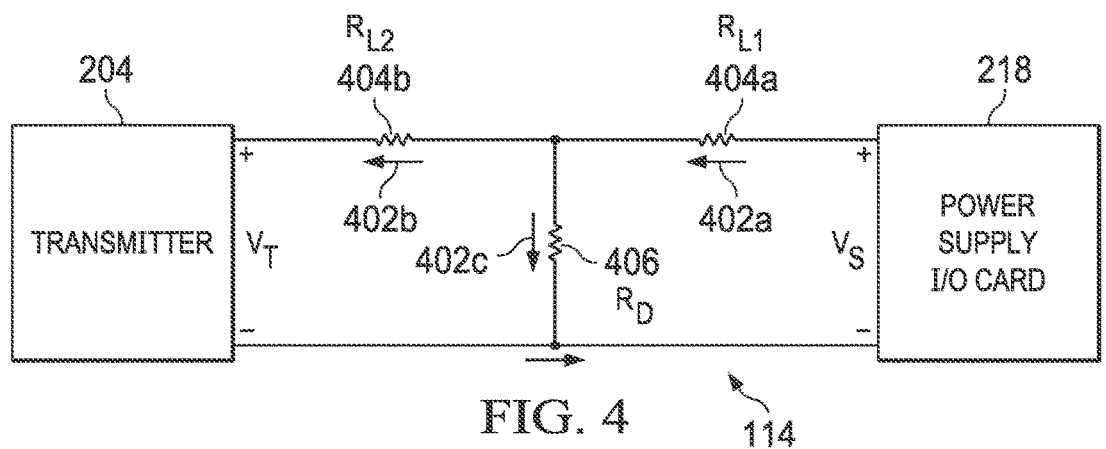
FIG. 4 illustrates an example operation of an I/O loop experiencing leakage according to this disclosure.

FIG. 4 illustrates an example operation of an I/O loop 114 experiencing leakage according to this disclosure. For ease of explanation, the operation shown in FIG. 4 is described as involving the I/O loop 114 shown in FIG. 2 within the industrial process control and automation system 100 shown in FIG. 1. However, the operation shown in FIG. 4 could be used with any other suitable I/O loop and in any other suitable system.

As shown in FIG. 4, a loop current 402*a* is being provided by the power supply I/O card 218 (or other power supply), but a smaller loop current 402*b* is being received by the transmitter 204. This is because a leakage current 402*c* is flowing between two portions of the I/O loop 114 without flowing through the transmitter 204. This is due to the presence of some type of electrical path having a leakage resistance $R_D$ 406. The leakage could be due to a number of factors, such as wiring wear or environmental factors. The presence of the leakage resistance 406 divides the normal loop resistance of the I/O loop 114 into multiple loop resistances 404*a*-404*b*. The loop resistance $R_{L1}$ 404*a* represents the resistance of the I/O loop 114 from the power supply I/O card 218 to the point where leakage is occurring. The loop resistance $R_{L2}$ 404*b* represents the resistance of the I/O loop 114 from the point where leakage is occurring to the transmitter 204.

Figure 5:
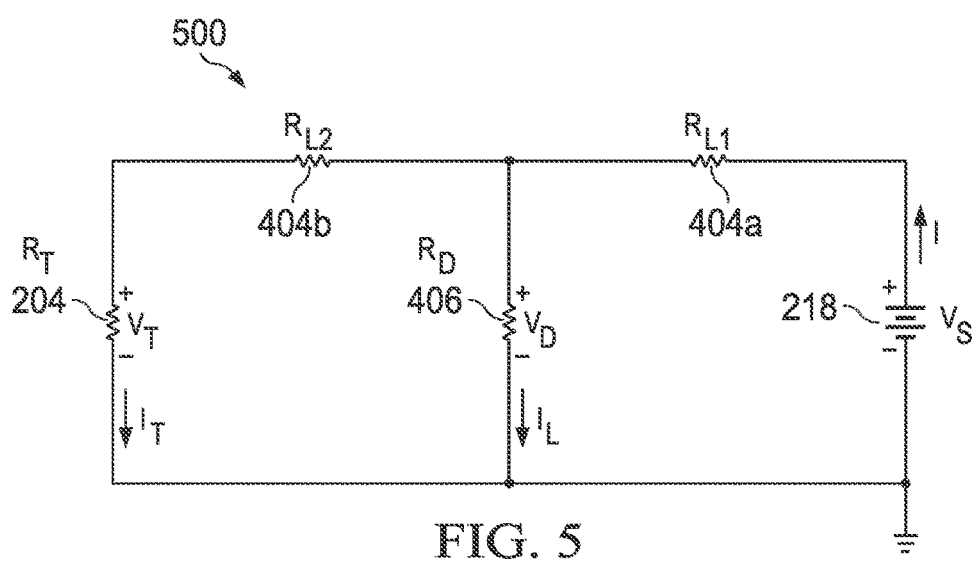
FIG. 5 illustrates an example equivalent circuit for an I/O loop experiencing leakage according to this disclosure.

FIG. 5 illustrates an example equivalent circuit 500 for an I/O loop 114 experiencing leakage according to this disclosure. In particular, FIG. 5 illustrates the equivalent circuit 500 of the arrangement shown in FIG. 4. In this equivalent circuit 500, the power supply I/O card 218 is represented as a voltage source, and the transmitter 204 is represented as a resistive load. Also, the voltage drop across the leakage resistance 406 is denoted $V_D$, the leakage current flowing through the leakage resistance 406 is denoted $I_L$, the loop current as set by the transmitter 204 is denoted $I_T$, and the total current drawn from the power supply I/O card 218 is denoted I.

Based on these notations, the following relationships can be expressed:

$$V_D = V_T + I_T \times R_{L2} \quad (5)$$

$$V_S = V_D + I \times R_{L1} \quad (6)$$

$$V_D = I_L \times R_D \quad (7)$$

$$I = I_T + I_L \quad (8)$$

From these equations, the following equations can be derived:

$$(V_S - V_D)/R_{L1} = I_T + V_D/R_D \quad (9)$$

$$\begin{aligned} V_S/R_{L1} &= V_D \times (1/R_{L1} + 1/R_D) + I_T \\ &= (V_T + I_T \times R_{L2}) \times (1/R_{L1} + 1/R_D) + I_T \\ &= V_T \times (1/R_{L1} + 1/R_D) + I_T \times R_{L2} \times (1/R_{L1} + 1/R_D) + I_T \\ &= V_T \times (1/R_{L1} + 1/R_D) + I_T \times (1 + R_{L2} \times (1/R_{L1} + 1/R_D)) \\ &= V_T \times (1 + R_{L1}/R_D) + I_T \times (R_{L1} + R_{L2} \times (1 + R_{L1}/R_D)) \end{aligned} \quad (10)$$

$$V_S = V_T \times R_A + I_T \times R_B \quad (11)$$

where:

$$R_A = (1 + R_{L1}/R_D) \quad (12)$$

$$R_B = (R_{L1} + R_{L2} \times (1 + R_{L1}/R_D)) \quad (13)$$

In the leakage scenario shown in FIG. 4, the loop resistance of the I/O loop 114 can be determined as follows. The transmitter 204 can set a first loop current $I_{T1}$ and measure a first voltage $V_{T1}$ across its terminals. The transmitter 204 can also set a second loop current $I_{T2}$ and measure a second voltage $V_{T2}$ across its terminals. Using those values, the following relationships can be expressed:

$$V_S = V_{T1} \times R_A + I_{T1} \times R_B \quad (14)$$

$$V_S = V_{T2} \times R_A + I_{T2} \times R_B \quad (15)$$

From Equations (14) and (15), the following can be derived:

$$R_A = (I_{T2} - I_{T1}) \times V_S / (I_{T2} \times V_{T1} - I_{T1} \times V_{T2}) \quad (16)$$

$$R_B = (V_{T2} - V_{T1}) \times V_S / (V_{T2} \times I_{T1} - V_{T1} \times I_{T2}) \quad (17)$$

$$R_B/R_A = -(V_{T2} - V_{T1})/(I_{T2} - I_{T1}) = -\Delta V_T/\Delta I_T \quad (18)$$

The ratio $R_B/R_A$ can also be rewritten as follows:

$$\begin{aligned} R_B/R_A &= R_{L2} + R_{L1} \times (1 - R_{L1}/R_D) \\ &= R_L - R_{L1}^2/R_D \end{aligned} \quad (19)$$

where:

$$R_L = R_{L1} + R_{L2} \quad (20)$$

Note that $R_B/R_A$ here is independent of the supply voltage $V_S$.

In the presence of no leakage, the leakage resistance 406 in FIGS. 4 and 5 can be assumed to have an infinitely large resistance, so the expression $(R_{L1}^2/R_D)$ in Equation (19) becomes zero. This allows Equation (19) to be rewritten as follows:

$$R_B/R_A = R_L = -\Delta V_T/\Delta I_T \quad (21)$$

As can be seen here, this is consistent with the calculation of the loop resistance as defined in Equation (4). During leakage, the leakage resistance 406 is not infinitely large, so the following can be derived:

$$R_B/R_A = -\Delta V_T/\Delta I_T = R_L - R_{L1}^2/R_D < R_L \quad (22)$$

In Equation (22), the value of $R_B/R_A$ is less than $R_L$ when current leakage is occurring.

Thus, it is possible for a transmitter 204, control system component 206, or other component to identify leakage current in an I/O loop 114. For example, the loop resistance 304 of the I/O loop 114 can be determined when the I/O loop 114 is in a known good state, such as during installation or commissioning of the transmitter 204 or at any other suitable time. The transmitter 204 can calculate the loop resistance 304 of the I/O loop 114 here by setting the loop currents $I_{T1}$ and $I_{T2}$, measuring the resulting voltages $V_{T1}$ and $V_{T2}$, and determining the value of $(-\Delta V_T/\Delta I_T)$, which as shown above identifies the overall loop resistance 304 of the I/O loop 114. Again, this can be done once or multiple times to identify the baseline loop resistance. Over time, the transmitter 204 can repeatedly measure the voltages $V_{T1}$ and $V_{T2}$ and currents $I_{T1}$ and $I_{T2}$ of the transmitter 204 and calculate the values of $R_A$ and/or ($R_B/R_A$), such as by using Equations (16)-(18) above. The resulting values can be used by the transmitter 204 to identify whether leakage has developed in the I/O loop 114.

Table 1 below summarizes how the $R_A$ and $R_B/R_A$ values might be used by the transmitter 204 to detect leakage.

TABLE 1

|  | $R_A$ | $R_B/R_A$ |
| --- | --- | --- |
| No leakage present | 1 | $R_L$ |
| Leakage present | >1 | <$R_L$ |
| Supply voltage $V_s$ changed | ≠1 | $R_L$ |
| Temperature effect on $R_L$ | 1 | $R_L + \delta \times R_L$ |

As shown here, when there is no leakage current, the value of $R_A$ should approximately equal one, and the value of $R_B/R_A$ should approximately equal the baseline loop resistance $R_L$. However, if leakage is present, the value of $R_A$ should become larger than one, and the value of $R_B/R_A$ should become lower than the baseline loop resistance $R_L$. As a result, one or both of these values can be used as an indication to detect leakage current. A change in the supply voltage $V_S$ can be detected when $R_A$ does not equal one and the value of $R_B/R_A$ approximately equals the baseline loop resistance $R_L$. Temperature effects on the loop resistance can be detected when $R_A$ approximately equals one and the value of $R_B/R_A$ exceeds the baseline loop resistance $R_L$ (typically by some small amount). Note that these last two conditions may or may not need to be detected. Also note that the monitoring of the loop resistance as discussed above with respect to FIG. 3 could be used to detect leakage current (since leakage current reduces the measured loop resistance).

It should be noted that accuracy errors in capturing measurements, thermal drift (changes in temperature), and long-term drift can affect the calculations described above. For example, thermal drift and long-term drift can affect the values of $V_S$ and $R_L$. As other examples, a digital-to-analog converter (DAC) used in the transmitter 204 for converting digital values into a transmitted analog signal can have accuracy errors, and an analog-to-digital converter (ADC) used in the transmitter 204 for converting $V_T$ measurements into digital values can have accuracy errors.

With respect to the thermal and long-term drift of the supply voltage $V_S$, these drifts do not occur very quickly in short periods of time. Rather, significant time is required for the supply voltage $V_S$ to change because of these drifts. Since measurements for loop resistance calculation or leakage detection can be captured during short intervals of time, it can be assumed that the supply voltage $V_S$ is constant during that period, and drift may not be a factor. Note that the value of ($R_B/R_A$) is independent of $V_S$ while $R_A$ is dependent on $V_S$, so this can be used to identify $V_S$ drift as shown in Table 1 above if desired. With respect to accuracy errors and drift affecting measurements of the transmitter loop current and transmitter voltage, it can be shown that the worst case errors are very small, allowing accurate and loop resistance measurements and leakage current detection (especially with the use of higher-resolution ADCs used for converting $V_T$ measurements into digital values).

Although FIGS. 3 and 4 illustrate examples of operations of an I/O loop 114 and FIG. 5 illustrates an example of an equivalent circuit 500 for an I/O loop 114, various changes may be made to FIGS. 3 through 5. For example, the specific I/O loop 114 shown here is for illustration only. Also, the equivalent circuit 500 shown here is based on the specific leakage shown to be occurring in the specific I/O loop 114. Any other suitable I/O loops and equivalent circuits could be used. Also, the equations shown above are merely meant to illustrate how measurements can be used to identify loop resistance and leakage current in the specific I/O loop 114. Any other suitable equations can be derived and used to accomplish these tasks. In addition, specific values shown above (such as accuracy percentages, bit numbers, temperature ranges, Ohms, and currents) are for illustration only and can vary depending on the implementation.

Figure 6:
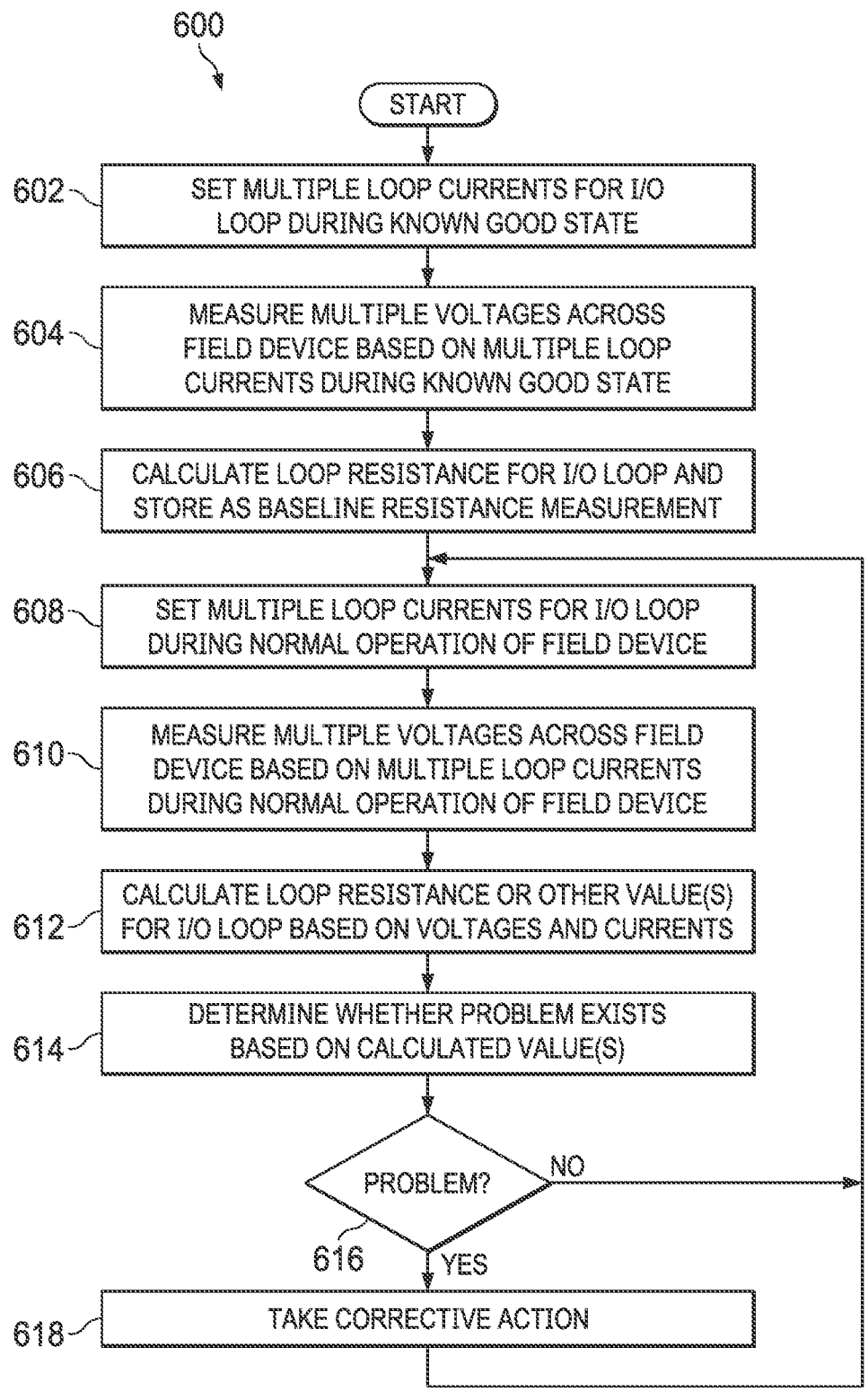
FIG. 6 illustrates an example method for detection of loop resistance and leakage current in an I/O loop according to this disclosure.

FIG. 6 illustrates an example method 600 for detection of loop resistance and leakage current in an I/O loop according to this disclosure. For ease of explanation, the method 600 is described as involving the I/O loop 114 shown in FIG. 2 within the industrial process control and automation system 100 shown in FIG. 1. However, the method 600 shown in FIG. 6 could be used with any other suitable I/O loop and in any other suitable system.

As shown in FIG. 6, multiple loop currents are set in an I/O loop in a known good state at step 602, and multiple voltages across a field device's terminals are measured at step 604. This could include, for example, the transmitter 204 setting loop currents $I_{T1}$ and $I_{T2}$ to flow through the I/O loop 114. This could also include the transmitter 204 measuring the voltages $V_{T1}$ and $V_{T2}$ across its terminals. These operations occur when the I/O loop 114 is operating in a known good state, such as during installation or commissioning of the transmitter 204 or at other times when no leakage current or other problems exists. A loop resistance of the I/O loop is calculated and stored as a baseline resistance measurement at step 606. This could include, for example, the transmitter 204 using Equation (4) above to calculate the loop resistance of the I/O loop 114. This could also include the transmitter 204 storing the calculated loop resistance as a baseline resistance of the I/O loop 114. As noted above, these operations could be repeated multiple times to calculate multiple loop resistances that are averaged together or otherwise processed to generate the baseline resistance.

During normal operation of the field device, multiple loop currents in the I/O loop are set at step 608, and multiple voltages across the field device's terminals are measured at step 610. This could include, for example, the transmitter 204 again setting loop currents $I_{T1}$ and $I_{T2}$ to flow through the I/O loop 114 and again measuring the voltages $V_{T1}$ and $V_{T2}$ across its terminals. The loop resistance or other value(s) for the I/O loop are calculated using the voltage and current measurements at step 612. This could include, for example, the transmitter 204 using Equation (4) above to calculate the loop resistance of the I/O loop 114. This could also include the transmitter 204 calculating one or more values that are based on resistances in the I/O loop 114, such as by calculating the values $R_A$ and ($R_B/R_A$) using Equations (16)-(18).

A determination is made whether any problem exists with the I/O loop based on the calculated value(s) at step 614. This could include, for example, the transmitter 204 determining whether the recent loop resistance measurement of the I/O loop 114 differs from the stored baseline resistance by a specified amount or percentage. This could also include the transmitter 204 determining whether the recent values that are based on the resistances in the I/O loop 114 are indicative of the presence of leakage current. As a particular example, this could include the transmitter 204 determining whether the recent $R_A$ value is greater than one and/or determining whether the recent ($R_B/R_A$) value is less than the stored baseline resistance. If no problem is detected at step 616, the process can return to step 608. If a problem is detected at step 616, corrective action can be taken at step 618. This could include, for example, the transmitter 204 generating a warning, alert, or other notification and providing the notification to at least one user, control system component, or other destination(s).

Although FIG. 6 illustrates one example of a method 600 for detection of loop resistance and leakage current in an I/O loop, various changes may be made to FIG. 6. For example, while shown as a series of steps, various steps in FIG. 6 could overlap, occur in parallel, occur in a different order, or occur any number of times. Also, while shown as involving both the monitoring of loop resistance and leakage current, the method 600 could involve the monitoring of loop resistance or the monitoring of leakage current (but not both). In addition, as noted above, various steps in FIG. 6 may occur outside the transmitter 204 based on information provided by the transmitter 204.

In some embodiments, various functions described in this patent document are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable storage device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The term "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising:
at least one processing device configured to:
obtain different measurements of voltages across terminals of a field device coupled to an input/output (I/O) loop, the voltage measurements associated with corresponding loop currents flowing through the I/O loop;
identify a baseline loop resistance measurement of the I/O loop using the voltage measurements and the loop currents;
obtain additional measurements of voltages across the terminals of the field device, the additional voltage measurements associated with additional corresponding loop currents flowing through the I/O loop;
identify additional loop resistance measurements of the I/O loop using the additional voltage measurements and the additional loop currents, wherein the additional loop resistance measurement of the I/O loop is determined using $R_B/R_A = -\Delta V_T/\Delta I_T = R_L - R_{L1}^2/R_D$, where the value of $R_B/R_A$ comprises at least one of:
less than $R_L$, a leakage current is detected,
equal to 1, no leakage current is detected,
not equal to 1, a change in the supply voltage Vs is detected,
equal to 1 and exceeds the $R_L$, a temperature effect is detected; and
detect a problem with the I/O loop based on the baseline loop resistance measurement and the additional loop resistance measurements.

2. The apparatus of claim 1, wherein the at least one processing device is configured to identify the baseline loop resistance measurement using a difference between the voltage measurements and a difference between the loop currents.

3. The apparatus of claim 1, wherein:
the field device comprises the at least one processing device; and
the field device further comprises:
multiple electrical terminals configured to be coupled to the I/O loop; and
a memory configured to store the baseline loop resistance measurement.

4. The apparatus of claim 1, wherein the at least one processing device is further configured to generate and output a notification in response to detecting the problem with the I/O loop.

5. The apparatus of claim 1, wherein the voltage measurements are captured when the I/O loop is in a known good state.

6. A method comprising:
obtaining different measurements of voltages across terminals of a field device coupled to an input/output (I/O) loop, the voltage measurements associated with corresponding loop currents flowing through the I/O loop;
identifying a baseline loop resistance measurement of the I/O loop using the voltage measurements and the loop currents;
obtaining additional measurements of voltages across the terminals of the field device, the additional voltage measurements associated with additional corresponding loop currents flowing through the I/O loop;
identifying additional loop resistance measurements of the I/O loop using the additional voltage measurements and the additional loop currents, wherein the additional loop resistance measurement of the I/O loop is determined using $R_B/R_A = -\Delta V_T/\Delta I_T = R_L - R_{L1}^2/R_D$, where the value of $R_B/R_A$ comprises at least one of:
less than $R_L$, a leakage current is detected,
equal to 1, no leakage current is detected,
not equal to 1, a change in the supply voltage Vs is detected,
equal to 1 and exceeds the $R_L$, a temperature effect is detected; and
detecting a problem with the I/O loop based on the baseline loop resistance measurement and the additional loop resistance measurements.

7. The method of claim 6, wherein the baseline loop resistance measurement is identified using a difference between the voltage measurements and a difference between the loop currents.

8. The method of claim 6, wherein the problem with the I/O loop comprises at least one of the additional loop resistance measurements exceeding or falling below the baseline loop resistance measurement by a threshold amount or percentage.

9. The method of claim 6, further comprising:
generating and outputting a notification in response to identifying the problem with the I/O loop.

10. The method of claim 6, wherein the voltage measurements are captured when the I/O loop is in a known good state.

11. An apparatus comprising:
at least one processing device configured to:
obtain different measurements of voltages across terminals of a field device coupled to an input/output (I/O) loop, the voltage measurements associated with corresponding loop currents flowing through the I/O loop;
identify one or more values that are based on resistances in the I/O loop using the voltage measurements and the loop currents, wherein the one or more values that are based on resistance additional loop resistance measurements, wherein the additional loop resistance measurement of the I/O loop is determined using $R_B/R_A = -\Delta V_T/\Delta I_T = R_L - R_{L1}^2/R_D$, where the value of $R_B/R_A$ comprises at least one of:
less than $R_L$, a leakage current is detected,
equal to 1, no leakage current is detected,
not equal to 1, a change in the supply voltage Vs is detected,
equal to 1 and exceeds the $R_L$, a temperature effect is detected; and
detect a presence of leakage current in the I/O loop based on the one or more values.

12. The apparatus of claim 11, wherein:
the at least one processing device is further configured to:
obtain initial measurements of voltages across the terminals of the field device, the initial voltage measurements associated with corresponding initial loop currents flowing through the I/O loop; and
identify a baseline loop resistance measurement of the I/O loop using the initial voltage measurements and the initial loop currents; and
the at least one processing device is configured to detect the presence of the leakage current using the baseline loop resistance measurement.

13. The apparatus of claim 12, wherein:
a specified one of the one or more values is based on a difference between the voltage measurements and a difference between the loop currents; and
the at least one processing device is configured to detect the presence of the leakage current based on the specified value falling below the baseline loop resistance measurement.

14. The apparatus of claim 11, wherein:
a specified one of the one or more values is based on the voltage measurements, the loop currents, and a supply voltage for the field device; and
the at least one processing device is configured to detect the presence of the leakage current based on the specified value being greater than a value of one.

15. The apparatus of claim 11, wherein the at least one processing device is further configured to generate and output a notification in response to detecting the presence of the leakage current.

16. A method comprising:
obtaining different measurements of voltages across terminals of a field device coupled to an input/output (I/O) loop, the voltage measurements associated with corresponding loop currents flowing through the I/O loop;
identifying one or more values that are based on resistances in the I/O loop using the voltage measurements and the loop currents, wherein the one or more values that are based on resistance additional loop resistance measurements, wherein the additional loop resistance measurement of the I/O loop is determined using $R_B/R_A = -\Delta V_T/\Delta I_T = R_L - R_{L1}^2/R_D$, where the value of $R_B/R_A$ comprises at least one of:
less than $R_L$, a leakage current is detected,
equal to 1, no leakage current is detected,
not equal to 1, a change in the supply voltage Vs is detected,
equal to 1 and exceeds the $R_L$, a temperature effect is detected; and
detecting a presence of leakage current in the I/O loop based on the one or more values.

17. The method of claim 16, wherein:
the method further comprises:
obtaining initial measurements of voltages across the terminals of the field device, the initial voltage measurements associated with corresponding initial loop currents flowing through the I/O loop; and
identifying a baseline loop resistance measurement of the I/O loop using the initial voltage measurements and the initial loop currents; and
the presence of the leakage current is detected using the baseline loop resistance measurement.

18. The method of claim 17, wherein:

a specified one of the one or more values is based on a difference between the voltage measurements and a difference between the loop currents; and the presence of the leakage current is detected based on the specified value falling below the baseline loop resistance measurement.

19. The method of claim 16, wherein:

a specified one of the one or more values is based on the voltage measurements, the loop currents, and a supply voltage for the field device; and the presence of the leakage current is detected based on the specified value being greater than a value of one.

20. The method of claim 16, further comprising:

generating and outputting a notification in response to detecting the presence of the leakage current.

* * * * *